United States Patent
Tsuchiya et al.

(10) Patent No.: US 8,593,766 B2
(45) Date of Patent: Nov. 26, 2013

(54) MAGNETO-RESISTIVE EFFECT ELEMENT HAVING SPACER LAYER INCLUDING MAIN SPACER LAYER CONTAINING GALLIUM OXIDE AND METAL INTERMEDIATE LAYER

(75) Inventors: Yoshihiro Tsuchiya, Tokyo (JP); Tsutomu Chou, Tokyo (JP); Hironobu Matsuzawa, Tokyo (JP); Hayato Koike, Tokyo (JP)

(73) Assignee: TDK Corporation, Tokyo (JP)

( * ) Notice: Subject to any disclaimer, the term of this patent is extended or adjusted under 35 U.S.C. 154(b) by 127 days.

(21) Appl. No.: 13/031,822

(22) Filed: Feb. 22, 2011

(65) Prior Publication Data

US 2012/0212859 A1    Aug. 23, 2012

(51) Int. Cl.
*G11B 5/39* (2006.01)

(52) U.S. Cl.
USPC ............... 360/324; 360/324.1; 360/324.2

(58) Field of Classification Search
USPC ..................... 360/313–328; 428/810–816
See application file for complete search history.

(56) References Cited

U.S. PATENT DOCUMENTS

| | | | |
|---|---|---|---|
| 5,764,567 A * | 6/1998 | Parkin | 365/173 |
| 6,359,289 B1 | 3/2002 | Parkin | |
| 2001/0012186 A1 | 8/2001 | Sakakima et al. | |
| 2004/0144995 A1* | 7/2004 | Nagahama et al. | 257/200 |
| 2005/0110004 A1* | 5/2005 | Parkin et al. | 257/30 |
| 2008/0062557 A1 | 3/2008 | Tsuchiya et al. | |
| 2008/0100968 A1 | 5/2008 | Shimazawa et al. | |
| 2008/0106827 A1 | 5/2008 | Shimazawa et al. | |
| 2009/0002893 A1 | 1/2009 | Tsuchiya et al. | |
| 2012/0002330 A1* | 1/2012 | Matsuzawa et al. | 360/313 |

FOREIGN PATENT DOCUMENTS

| JP | A-2003-086863 | 3/2003 |
|---|---|---|
| JP | A-2010-044848 | 2/2010 |

OTHER PUBLICATIONS

Office Action dated Feb. 5, 2013 mailed in corresponding JP Application No. 2011-288243 (English translation).

* cited by examiner

*Primary Examiner* — Craig A. Renner
(74) *Attorney, Agent, or Firm* — Posz Law Group, PLC

(57) ABSTRACT

A magneto-resistive effect (MR) element includes first and second magnetic layers in which a relative angle formed by magnetization directions changes responsive to an external magnetic field, and a spacer layer positioned between the first and second magnetic layers. The first magnetic layer is positioned closer to a substrate above which the MR element is formed than the second magnetic layer. The spacer layer includes copper and metal intermediate layers and a main spacer layer composed primarily of gallium oxide. The copper and metal intermediate layers are positioned between the main spacer and first magnetic layers. The metal intermediate layer is positioned between the copper and main spacer layers. The metal intermediate layer is composed primarily of at least one from a group of one of magnesium and at least partially oxidized magnesium, and one of aluminum and at least partially oxidized aluminum.

8 Claims, 6 Drawing Sheets

MAGNETO-RESISTIVE EFFECT ELEMENT HAVING SPACER LAYER INCLUDING MAIN SPACER LAYER CONTAINING GALLIUM OXIDE AND METAL INTERMEDIATE LAYER

BACKGROUND OF THE INVENTION

1. Field of the Invention

The present invention relates to a magneto-resistive effect (MR) element and a manufacturing method thereof, and particularly relates to a configuration of a spacer layer.

2. Description of the Related Art

Reproducing heads with high sensitivity and high output are in demand in conjunction with condensing of high recording density in hard disk drives (HDD). As an example of this type of reproducing head, a spin valve head has been developed. A spin valve head includes a nonmagnetic metal layer and a pair of ferromagnetic layers positioned on both sides of the nonmagnetic metal layer in a manner of contacting the nonmagnetic metal layer. The magnetization direction of one of the ferromagnetic layers is pinned in one direction (hereinafter, this type of layer is referred to as a magnetization pinned layer), and the magnetization direction of the other one of the ferromagnetic layers freely rotates in response to an external magnetic field (hereinafter, this type of layer is referred to as a magnetization free layer). When the external magnetic field is applied, the relative angle of the spins between the magnetization pinned layer and the magnetization free layer changes so that magneto-resistive change is realized. Typically, the magnetization direction of the magnetization pinned layer is pinned by utilizing exchange coupling force of an anti-ferromagnetic layer.

In the meantime, in order to realize further condensing of high recording density, a reduction of a read gap (a space between upper and lower shield layers) is required. However, when the read gap is reduced to approximately 20 nm, it is difficult to place an anti-ferromagnetic layer within the read gap. Therefore, a configuration has been developed in which a pair of magnetization free layers is arranged on both sides of a spacer layer. According to this configuration, reduction of the read gap is easily realized because no anti-ferromagnetic layer is required.

With either configuration, the spacer layer is a necessary component to realize the magneto-resistive change. Materials for the spacer layer that are promising for achieving a large magneto-resistive ratio (hereinafter referred to as MR ratio) have been developed. Conventionally, a technology has been known that an MR ratio is increased by disposing a resistance adjustment layer in a spacer layer and by narrowing a path where a sense current flows. However, since sense current is concentrated to a conductive part and thereby a current density is increased, this technology is not preferable from the view point of reliability. U.S. Patent Application Publication No. 2008/0062557 discloses a technology that an oxide semiconductor layer such as ZnO, TiO and the like is used as a part of a spacer layer. Since this technology allows to prevent a sense current from being concentrated, it is possible to increase the reliability while the MR ratio is increased.

The ferromagnetic layers adjacent to the spacer layer are normally composed of Co, Ni, Fe and the like as a primary component. When these elements are positioned in a manner of contacting the oxide semiconductor layer, the ferromagnetic layers may be oxidized by an oxidation action of oxygen contained in the oxide semiconductor layer. Thereby, polarizability may be decreased and the MR ratio may be lowered. U.S. Patent Application Publication No. 2008/0062557 further discloses a technology that a nonmagnetic metal layer composed of copper, gold, silver or the like is disposed between a ferromagnetic layer composed of CoFe and the like and an oxide semiconductor layer. It is expected that these nonmagnetic metal layers prevent diffusion of oxygen contained in the oxide semiconductor layer and oxidation of the ferromagnetic layer. However, with the nonmagnetic metal layers composed of copper, gold, silver or the like, sufficient antioxidant effects are often not obtained in particular when the diffusion of oxygen is likely to occur under a high temperature environment.

It is an object of the present invention to provide an MR element where oxidation of a magnetic layer adjacent to a spacer layer is prevented and in which a large MR ratio is realized.

SUMMARY OF THE INVENTION

A magneto-resistive effect (MR) element according to the present invention includes first and second magnetic layers in which a relative angle formed by magnetization directions changes in response to an external magnetic field, and a spacer layer positioned between the first magnetic layer and the second magnetic layer. The first magnetic layer is positioned closer to a substrate above which the MR element is formed than the second magnetic layer. The spacer layer includes a copper layer, a metal intermediate layer and a main spacer layer composed of gallium oxide as a primary component. The copper layer and the metal intermediate layer are positioned between the main spacer layer and the first magnetic layer. The metal intermediate layer is positioned between the copper layer and the main spacer layer. The metal intermediate layer is composed of at least one member selected from a group consisting of one of magnesium and at least partially oxidized magnesium, one of aluminum and at least partially oxidized aluminum, and one of zinc and at least partially oxidized zinc, as a primary component.

Since the spacer layer that includes the main spacer layer composed of gallium oxide as a primary component has a higher resistance than a conventional spacer layer formed with a metal layer such as copper or the like, a large MR ratio can be realized. Normally, gallium oxide exists in an amorphous state under a thin film condition. Even in the amorphous state, it is possible to have a large band gap. Also, there is an advantage in that a lattice matching (matching lattice constants of two adjacent materials) with magnetic layers adjacent to the spacer layer is unnecessary.

In the meantime, as described above, the magnetic layers adjacent to the spacer layer are normally composed of Co, Nr, Fe and the like as a primary component. Therefore, when these elements are positioned in a manner of contacting gallium oxide, the magnetic layers are oxidized due to an oxidation action of oxygen contained in gallium oxide, and thereby an MR ratio may be decreased. Specifically, gallium oxide may oxidize the elements configuring the first magnetic layer since oxygen contained in gallium oxide is diffused. Thereby, polarizability may be decreased and the MR ratio may be lowered. This phenomenon, that is, a diffusion phenomenon of oxygen contained in gallium oxide, is more likely to occur especially under high temperature. A heating process may be performed on the MR element after a lamination film is formed, and the decrease in the MR ratio due to the oxidation of the first magnetic layer may become remarkable when the heating process is performed. Also, since the inside of the hard disk drive is often operated under high temperature environment, the oxidation of the first magnetic layer may contribute to decrease the reliability of the magnetic head.

Accordingly, in the present invention, a portion of the spacer layer is configured with a copper layer. The copper layer has an effect to prevent the diffusion of oxygen contained in gallium oxide and also an effect to adjust a resistance area (RA) in an appropriate value. However, as described above, sufficient antioxidation effects cannot be produced only with the copper layer especially under a high temperature environment.

Therefore, in the present invention, a metal intermediate layer is provided between the copper layer and the main spacer layer composed of gallium oxide as a primary component. The metal intermediate layer is composed of at least one member selected from a group consisting of one of magnesium and at least partially oxidized magnesium, one of aluminum and at least partially oxidized aluminum, and one of zinc and at least partially oxidized zinc, as a primary component. Compared to Co, Ni and Fe that configure the first magnetic layer, magnesium, aluminum and zinc have a lower standard electrode potential and are more likely to be oxidized than Co, Ni and Fe. Therefore, even in a partially-oxidized state as well as in a metal state, these elements trap oxygen and prevent oxygen from reaching to the first magnetic layer. While magnesium, aluminum and zinc themselves become metal oxides as described above and cooperate with the copper layer, further enhanced oxygen diffusion prevention effect can be provided.

The above-described objects, features, and advantages of the present specification, as well as other objects, features, and advantages of the present specification will be evident by the below detailed description with reference to attached drawings illustrating the present application.

DETAILED DESCRIPTION OF THE INVENTION

An MR element according to embodiments of the present invention and a number of embodiments of a thin film magnetic head using the MR element will be explained utilizing the drawings.

First Embodiment

Figure 1:
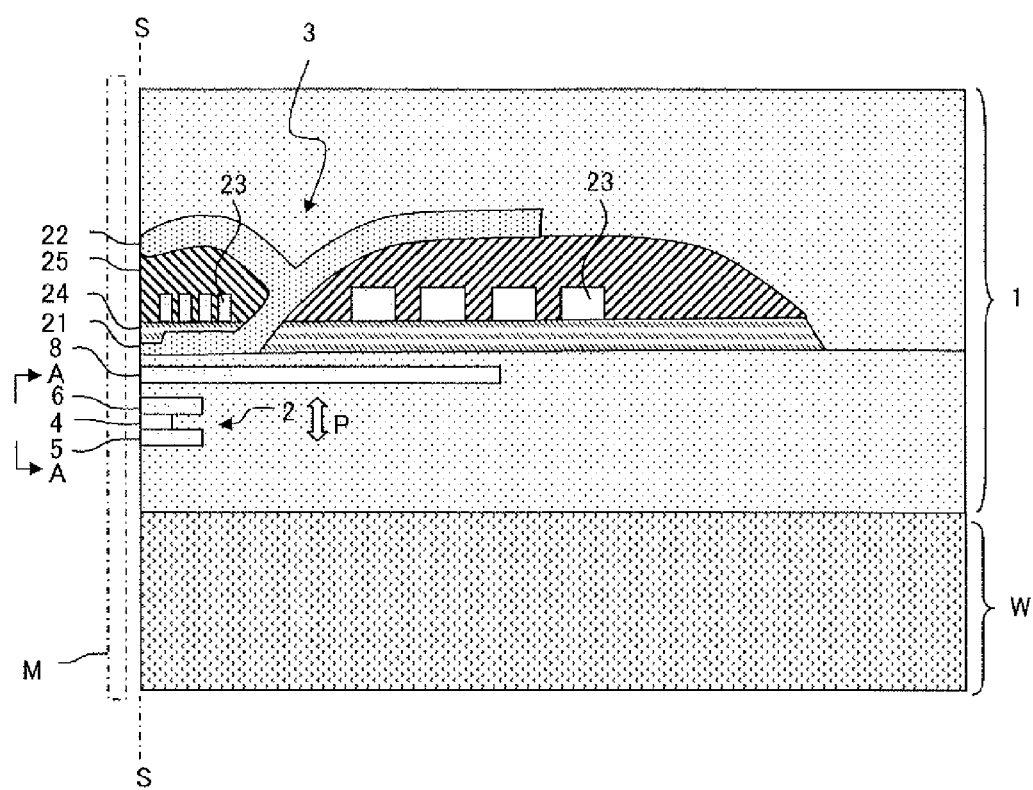
FIG. 1 is a main part cross-sectional view of a thin film magnetic head according to a first embodiment.
Figure 2:
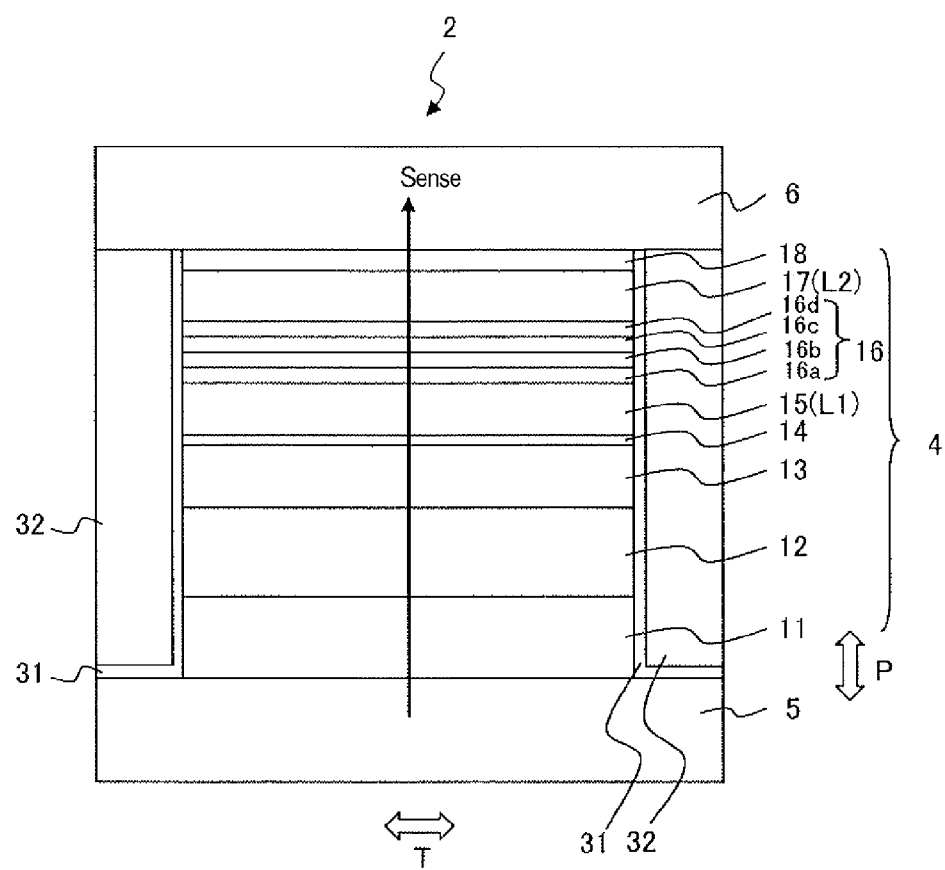
FIG. 2 is a side view of an MR element, as viewed from the A-A direction in FIG. 1, that is, an air bearing surface.

FIG. 1 illustrates a main part cross-sectional view of a thin film magnetic head 1 according to a first embodiment. The thin film magnetic head 1 is formed on a substrate W and includes a reproducing head 2 and a recording head 3. FIG. 2 illustrates a side view of the reproducing head 2 as viewed from the A-A direction in FIG. 1, that is, a layer configuration on an air bearing surface S of the reproducing head 2. The air bearing surface S is a surface of the thin film magnetic head 1 that opposes a recording medium M. First, a description will be given regarding a configuration of the reproducing head 2 with reference to FIG. 2.

The reproducing head 2 includes a spin valve type MR element 4, upper and lower shield layers 6 and 5 disposed in a manner of sandwiching the MR element 4 in a film surface orthogonal direction (lamination direction) P, and bias magnetic field application layers 32 disposed on both sides in the track width direction T of the MR element 4 (direction orthogonal to the sheet surface of FIG. 1). A tip end part of the MR element 4, as illustrated in FIG. 1, is arranged on the air bearing surface S. The MR element 4 is arranged such that sense current Sense flows in a film surface orthogonal direction P by a voltage applied between the upper shield layer 6 and the lower shield layer 5. A magnetic field from the recording medium M at a position opposing the MR element 4 changes by rotation of the recording medium M. The magnetic field change is detected as an electrical resistance change of the sense current Sense based on a magneto-resistive effect. The MR element 4 reads magnetic information written in the recording medium M utilizing this principle.

Table 1 illustrates an example of a layer configuration of the MR element 4. Table 1 describes the lower shield layer 5 through the upper shield layer 6 from bottom to up in the lamination order.

TABLE 1

| Layer Configuration | | | Material | Film Thickness (nm) |
|---|---|---|---|---|
| Upper Shield Layer 6 | | | NiFe | 2000 |
| MR Element 4 | Protective Layer 18 | | Ru | 2.0 |
| | Magnetization Free Layer 17 (Second Magnetic Layer L2) | | CoFe | 4.0 |
| | Spacer Layer 16 | Nonmagnetic Layer 16d | Zn or Cu | 0.4 |
| | | Main Spacer Layer 16c | GaOx | 0.9 |
| | | Metal Intermediate Layer 16b | Mg, Al, Zn or at least partially oxidized Mg, Al, Zn | 0.05-0.4 |
| | | Copper Layer 16a | Cu | 0.4 |
| | Inner Magnetization Pinned Layer 15 (First Magnetic Layer L1) | | CoFe | 3.5 |
| | Exchange Coupling Transmitting Layer 14 | | Ru | 0.8 |

TABLE 1-continued

| Layer Configuration | Material | Film Thickness (nm) |
|---|---|---|
| Outer Magnetization Pinned Layer 13 | CoFe | 3.0 |
| Anti-Ferromagnetic Layer 12 | IrMn | 5.0 |
| Under Layer 11 | NiCr | 4.0 |
| Lower Shield Layer 5 | NiFe | 2000 |

The MR element 4 has a layer configuration in which the following layers are laminated above the lower shield layer 5 formed with an NiFe layer in this order: an under layer 11, an anti-ferromagnetic layer 12, an outer magnetization pinned layer 13, an exchange coupling transmitting layer 14, an inner magnetization pinned layer 15 (first magnetic layer L1), a spacer layer 16, a magnetization free layer 17 (second magnetic layer L2), and a protective layer 18. The protective layer 18 is covered by the upper shield layer 6 formed with a NiFe layer.

The under layer 11 is disposed in order to obtain a favorable exchange coupling between the outer magnetization pinned layer 13 and the anti-ferromagnetic layer 12 laminated above the under layer 11. The outer magnetization pinned layer 13 is exchange coupled with the anti-ferromagnetic layer 12 composed of IrMn. The outer magnetization pinned layer 13 is exchange coupled with the inner magnetization pinned layer 15 with the exchange coupling transmitting layer 14, which is composed of Ru, being positioned therebetween. As a result, the magnetization direction of the inner magnetization pinned layer 15 is firmly pinned. It is desirable that the inner magnetization pinned layer 15 is magnetized in a direction orthogonal to the air bearing surface S within the film plane. Since the magnetization directions of the inner magnetization pinned layer 15 and the outer magnetization pinned layer 13 are pinned in mutually antiparallel orientations, the overall magnetization of these combined areas may be suppressed. The magnetization free layer 17 in which the magnetization direction changes according to the external magnetic field is disposed above the inner magnetization pinned layer 15 with the spacer layer 16 sandwiched between the magnetization free layer 17 and the inner magnetization pinned layer 15. The protective layer 18 is disposed to prevent the deterioration of each laminated layer. The outer and inner magnetization pinned layers 13 and 15 as well as the magnetization free layer 17 are typically composed of CoFe; however, may also contain Ni.

The bias magnetic field application layers 32 are disposed on both sides in the track width direction of the MR element 4 with an insulating film 31 therebetween. The bias magnetic field application layers 32 are magnetic domain control films that change the magnetization free layer 17 to a single magnetic domain, and apply a bias magnetic field in the track width direction T to the magnetization free layer 17. The insulating layer 31 is composed of $Al_2O_3$, and the bias magnetic field application layers 32 are composed of CoPt, CoCrPt or the like.

The sense current Sense flows in the film surface orthogonal direction P in the MR element 4. The sense current Sense is supplied from the upper and lower shield layers 6 and 5 which also function as electrodes. The magnetization direction of the magnetization free layer 17 is controlled in the track width direction T, that is, in the direction orthogonal to the magnetization direction of the inner magnetization pinned layer 15, by a bias magnetic field from the bias magnetic field application layers 32 when no external magnetic field is applied. When the external magnetic field from the recording medium M is applied to the magnetization free layer 17, the magnetization direction of the magnetization free layer 17 rotates by a predefined angle in the predefined direction within the film plane according to the direction and strength of the external magnetic field. The magnetization direction of the magnetization free layer 17 forms a relative angle with the magnetization direction of the inner magnetization pinned layer 15 according to the direction and strength of the external magnetic field, and the spin dependent scattering of conductive electrons changes according to the relative angle, thereby a magneto-resistive change is generated. The MR element 4 detects this magneto-resistive change and reads magnetic information on the recording medium M.

The magnetization free layer 17 and the outer and inner magnetization pinned layers 13 and 15 may be disposed in a vertically reverse order relative to the spacer layer 16. In other words, the magnetization free layer 17 may be positioned closer to the substrate W than the outer and inner magnetization pinned layers 13 and 15. Specifically, the layers from the inner magnetization pinned layer 15 to the anti-ferromagnetic layer 12 are arranged between the protective layer 18 and the spacer layer 16 (arranged such that the inner magnetization pinned layer 15 is at the bottommost side and the anti-ferromagnetic layer 12 is at the topmost side), and the magnetization free layer 17 is arranged between the under layer 11 and the spacer layer 16.

In the present specification, of the magnetization free layer 17 and the inner magnetization pinned layer 15, the layer positioned closer to the substrate W above which the MR element 4 is formed, that is, the layer beneath the spacer layer 16 as viewed in the lamination direction, is referred to as the first magnetic layer L1, and the layer positioned farther from the first magnetic layer L1 as viewed from the substrate W, that is, the layer above the spacer layer 16 as viewed in the lamination direction, is referred to as the second magnetic layer L2. In the layer configuration illustrated in Table 1, the inner magnetization pinned layer 15 is the first magnetic layer L1, and the magnetization free layer 17 is the second magnetic layer L2. In the layer configuration with the reversed positional relation, the magnetization free layer 17 is the first magnetic layer L1, and the inner magnetization pinned layer 15 is the second magnetic layer L2.

The spacer layer 16 includes a main spacer layer 16c composed of gallium oxide as a primary component. The main spacer layer 16c may contain additives other than gallium oxide. The additives are, for example, metal oxides. Also, the mole fraction of gallium oxide in the main spacer layer 16c is preferably 50% or more. The composition of gallium oxide is expressed by the general formula GaOx where a range of x is $1.45 \leq x \leq 1.55$. The main spacer layer 16c is normally formed in an amorphous state. GaOx has a larger resistance value and also a larger resistance change compared to Cu used in the conventional spacer layer. Therefore, a larger MR ratio may be obtained compared to the conventional MR element in which Cu is used as a spacer layer.

Gallium oxide is a promising material for realizing a high MR ratio. However, since it contains oxygen, if the first and second magnetic layers L1 and L2 are adjacent to the main spacer layer 16c, elements such as Fe, Co, Ni and the like contained in the first and second magnetic layers L1 and L2, and particularly Fe, have a tendency for oxidation. When these elements are oxidized, there is a tendency for the MR ratio to fall.

Therefore, for the purpose of avoiding direct contact between the main spacer layer 16c and the first magnetic layer L1 such that oxidation of the first magnetic layer L1 is effectively prevented, the spacer layer 16 includes a copper layer 16a (Cu layer). The copper layer 16a is positioned between the main spacer layer 16c and the first magnetic layer L1. The copper layer 16a is preferably composed substantially of copper, and may contain a few amounts of additives. The copper layer 16a may be partially oxidized. That is, the copper layer 16a may be substantially composed of copper and oxygen. The copper layer 16a is positioned in contact with the first magnetic layer L1.

For the same purpose, the spacer layer 16 includes a nonmagnetic layer 16d composed of copper or zinc positioned between the main spacer layer 16c and the second magnetic layer L2 in a manner of contacting with both of the main spacer layer 16c and the second magnetic layer L2. From the same principle, the nonmagnetic layer 16d can prevent oxidation of the second magnetic layer L2. The nonmagnetic layer 16d is preferably composed substantially of copper or zinc, and may contain a small amount of additives. The nonmagnetic layer 16d may be partially oxidized. That is, the nonmagnetic layer 16d may be substantially composed of copper or zinc, and oxygen. The nonmagnetic layer 16d may be eliminated.

The spacer layer 16 further includes a metal intermediate layer 16b positioned between the copper layer 16a and the main spacer layer 16c. Therefore, the spacer layer 16 includes the copper layer 16a, the metal intermediate layer 16b, the main spacer layer 16c composed of gallium oxide as a primary component, and the nonmagnetic layer 16d composed of zinc or copper. Also, the copper layer 16a is positioned on a side closer to the first magnetic layer L1, and the main spacer layer 16c or the nonmagnetic layer 16d is positioned on a side closer to the second magnetic layer L2.

The metal intermediate layer 16b is composed of one member selected from a group consisting of: one of magnesium (Mg) and at least partially oxidized magnesium, one of aluminum (Al) and at least partially oxidized aluminum, and one of zinc (Zn) and at least partially oxidized zinc. In one embodiment, the metal intermediate layer 16b is composed of magnesium or at least partially oxidized magnesium as a primary component. In other words, the metal intermediate layer 16b is composed of magnesium, a mixture of magnesium and magnesium oxide (hereafter, referred to as mixed magnesium), or magnesium oxide as a primary component. The metal intermediate layer 16b may contain additives other than magnesium, mixed magnesium and magnesium oxide, such as metal oxides. However, the mole fraction of magnesium, mixed magnesium or magnesium oxide in the metal intermediate layer 16b is preferably 50% or more.

Instead of magnesium, aluminum or zinc can be used. In one embodiment, the metal intermediate layer 16b is composed of aluminum or at least partially oxidized aluminum as a primary component. That is, the metal intermediate layer 16b is composed of aluminum, a mixture of aluminum and aluminum oxide (hereafter, referred to as a mixed aluminum), or aluminum oxide as a primary component. In another embodiment, the metal intermediate layer 16b is composed of zinc or at least partially oxidized zinc as a primary component. That is, the metal intermediate layer 16b is composed of zinc, a mixture of zinc and zinc oxide (hereafter, referred to as a mixed zinc), or zinc oxide as a primary component.

As described later, since these metals have similar characteristics in the view point of oxidation prevention of the first magnetic layer L1, these metals can be used in a mixture. Therefore, the metal intermediate layer 16b is composed of two or more members selected from a group consisting of: one of magnesium and at least partially oxidized magnesium, one of aluminum and at least partially oxidized aluminum, and one of zinc and at least partially oxidized zinc. For example, the metal intermediate layer 16b may contain one of magnesium, mixed magnesium and magnesium oxide, and one of aluminum, mixed aluminum and aluminum oxide. In that case, the total of respective mole fractions is preferably 50% or more.

The metal intermediate layer 16b as well as the copper layer 16a prevents oxidation of the first magnetic layer L1. Standard electrode potentials of Mg, Al and Zn are respectively −2.356, −1.676 and −0.763. On the other hand, standard electrode potentials $E^0$ of Co, Fe and Ni that configure the first magnetic layer L1 are respectively −0.277, −0.440 and −0.257. These values are electrode potentials at the standard condition (25° C., 1 atm) based on the standard hydrogen electrode. Normally, when two or more types of metals are joined, a metal having a lower standard electrode potential value is preferentially oxidized. In the present embodiment, the metal intermediate layer 16b and the first magnetic layer L1 are not in a direct contact with each other; however, the possibility of oxidation can be similarly considered. Therefore, when oxygen contained in gallium oxide diffuses and travels toward the first magnetic layer L1 under a high temperature environment, Mg, Al and Zn that are more likely to be oxidized compared to Co, Fe and Ni trap oxygen so that oxidation of Co, Fe and Ni is prevented.

It is desirable that the metal intermediate layer 16b is positioned further from the first magnetic layer L1 than the copper layer 16a is. Similar to Mg, Al and Zn, Cu has a behavior to prevent oxidation of Co, Fe and Ni; however, the mechanism is different from Mg, Al and Zn. In other words, the standard electrode potential of Cu is 0.337 ($Cu^{2+}$+$2e^- \Leftrightarrow$ Cu) or 0.520 ($Cu^+$+$e^- \Leftrightarrow$ Cu) and is larger than the standard electrode potentials of Co, Fe and Ni. Cu does not trap oxygen, but Cu does not allow oxygen to come close so that oxidation of Co, Fe and Ni is prevented. Therefore, since the metal intermediate layer 16b with oxygen trapped therein is positioned further from the first magnetic layer L1 than the copper layer 16a that does not contain oxygen (or is less likely to contain) is, an oxygen distribution becomes small in the vicinity of the first magnetic layer L1 and becomes large in the vicinity of a gallium oxide layer. Since oxygen as a whole is distributed away from the first magnetic layer L1, a possibility is reduced in which oxygen trapped by Mg, Al and Zn abscises and reaches to the first magnetic layer L1. Also, even when oxygen is diffused toward the first magnetic layer L1, oxidation of the first magnetic layer L1 is prevented since Cu blocks oxygen.

The copper layer 16a also has a function to maintain RA in an appropriate value. It is desirable that the MR element in the present embodiment and an MR element in a second embodiment, which will be described later, have an RA of approximately 0.2 $\Omega \mu m^2$. To achieve that, it is desirable that the copper layer 16a contacts the first magnetic layer L1.

As described later, it is desirable that a film thickness of the metal intermediate layer 16b is 0.05 nm or more and 0.4 nm or less. When the film thickness is less than 0.05 nm, oxidation prevention effect is reduced, and when the film thickness is more than 0.4 nm, an MR ratio is lowered.

The metal intermediate layer 16b composed of at least partially oxidized magnesium, at least partially oxidized aluminum or at least partially oxidized zinc as a primary component is formed by being at least partially oxidized after magnesium, aluminum or zinc is formed in a metal state.

Referring to FIG. 1 again, the recording head 3 is disposed above the reproducing head 2 with an interelement shield layer 8 formed therebetween by a sputtering method or the like. The recording head 3 has a configuration for so-called perpendicular magnetic recording. The magnetic pole layer for writing is formed with a main magnetic pole layer 21 and an auxiliary magnetic pole layer 22. These magnetic pole layers are formed by a frame plating method or the like. The main magnetic pole layer 21 is formed of FeCo and is arranged relative to the air bearing surface S in an orientation nearly orthogonal to the air bearing surface S. A coil layer 23 extending over a gap layer 24 composed of an insulating material is wound around the periphery of the main magnetic pole layer 21 so that a magnetic flux is induced to the main magnetic pole layer 21 by the coil layer 23. The coil layer 23 is formed by a frame plating method or the like. The magnetic flux is guided through the main magnetic pole layer 21 and is emitted from the air bearing surface S towards the recording medium M. The main magnetic pole layer 21 is tapered not only in the film surface orthogonal direction P but also in the track width direction T near the air bearing surface S to generate a minute and strong write magnetic field for the high recording density.

The auxiliary magnetic pole layer 22 is a magnetic layer magnetically coupled with the main magnetic pole layer 21. The auxiliary magnetic pole layer 22 is a magnetic pole layer with a film thickness of approximately 0.01 µm to approximately 0.5 µm and is formed of an alloy composed of two or three of any of Ni, Fe, Co or the like. The auxiliary magnetic pole layer 22 is disposed in a manner of branching from the main magnetic pole layer 21 and opposes the main magnetic pole layer 21 with the gap layer 24 and a coil insulating layer 25 therebetween on the air bearing surface S side. The end part on the air bearing surface S side of the auxiliary magnetic pole layer 22 forms a trailing shield part in which the layer cross-section is larger than other parts of the auxiliary magnetic pole layer 22. When this type of auxiliary magnetic pole layer 22 is provided, the magnetic field gradient between the auxiliary magnetic pole layer 22 and the main magnetic pole layer 21 becomes steeper in the vicinity of the air bearing surface S. As a result, a signal output jitter is reduced, and an error rate during reading can be lowered.

Second Embodiment

Figure 3:
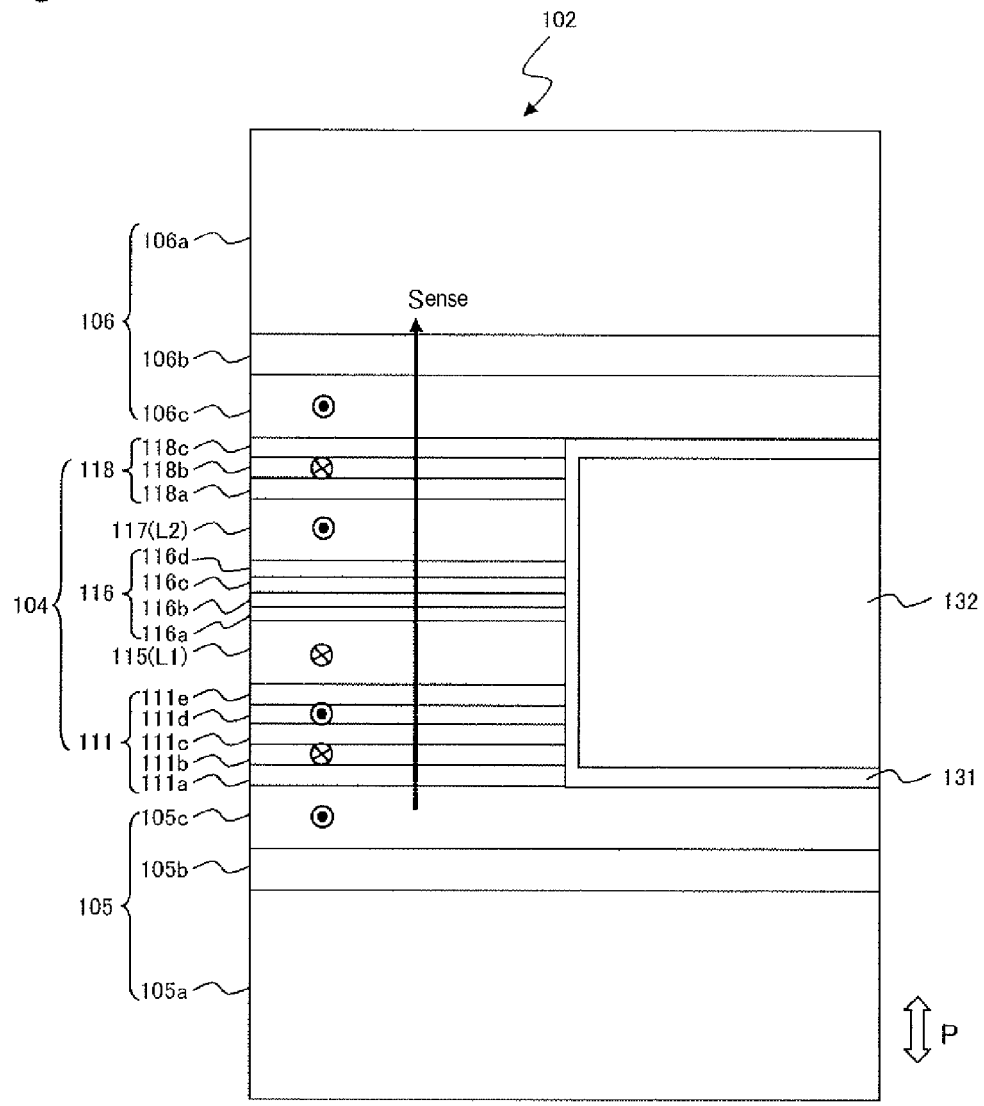
FIG. 3 is a cross-sectional view of an MR element according to a second embodiment, as viewed from the same direction as FIG. 1.

A thin film magnetic head 1 of the present embodiment is the same as the first embodiment illustrated in FIG. 1 with the exception of the configuration of the reproducing head 2. FIG. 3 and Table 2 illustrate a layer configuration of such an MR element. A reproducing head 102 includes an MR element 104 in which a large number of layers are laminated in the same manner as the first embodiment, and upper and lower shield layers 106 and 105 that are disposed so as to sandwich the MR element 104 in the film surface orthogonal direction P (lamination direction). The upper and lower shield layers 106 and 105 are also used as electrodes for the sense current Sense so that the sense current Sense flows in the film surface orthogonal direction P of the MR element 104.

With the present embodiment, the first magnetic layer L1 and the second magnetic layer L2 are magnetization free layers 115 and 117, respectively, in which the magnetization direction changes in response to the external magnetic field. A bias magnetic field application layer 132 is disposed on the backside of the MR element 104 as viewed from the air bearing surface S with an insulating layer 131 positioned therebetween and applies a bias magnetic field in a direction orthogonal to the air bearing surface S to the first and second magnetization free layers 115 and 117 (first and second magnetic layers L1 and L2). A spacer layer 116 is disposed between the first and second magnetization free layers 115 and 117. A first magnetic linkage layer 111 is disposed between the first magnetization free layer 115 and the lower shield layer 105, and a second magnetic linkage layer 118 is disposed between the second magnetization free layer 117 and the upper shield layer 106.

TABLE 2

| | Film Configuration | | Material | Film Thickness (nm) |
|---|---|---|---|---|
| Upper Shield Layer 106 | Second Main Shield Layer 106a | | NiFe | 2000 |
| | Second Anti-Ferromagnetic Layer 106b | | IrMn | 6.0 |
| | Second Exchange Coupling Magnetic Field Application Layer 106c | | CoFe | 1.5 |
| | | | NiFe | 20 |
| MR Element 104 | Second Magnetic Linkage Layer 118 | Exchange Coupling Transmitting Layer 118c | Ru | 0.8 |
| | | Gap Adjustment Layer 118b | CoFe | 1.0 |
| | | Exchange Coupling Transmitting Layer 118a | Ru | 0.8 |
| | Second Magnetization Free Layer 117 (Second Magnetic Layer L2) | | CoFe | 4.0 |
| | Spacer Layer 116 | Nonmagnetic Layer 116d | Zn or Cu | 0.4 |
| | | Main Spacer Layer 116c | GaOx | 0.9 |
| | | Metal Intermediate Layer 116b | Mg, Al, Zn or at least partially oxidized Mg, Al, Zn | 0.05-0.4 |
| | | Copper Layer 116a | Cu | 0.4 |
| | First Magnetization Free Layer 115 (First Magnetic Layer L1) | | CoFe | 4.0 |
| | First Magnetic Linkage | Exchange Coupling Transmitting Layer 111e | Ru | 0.8 |

TABLE 2-continued

| | Film Configuration | Material | Film Thickness (nm) |
|---|---|---|---|
| | Layer 111   Gap Adjustment Layer 111d | CoFe | 1.0 |
| | Exchange Coupling Transmitting Layer 111c | Ru | 0.8 |
| | Gap Adjustment Layer 111b | CoFe | 1.0 |
| | Exchange Coupling Transmitting Layer 111a | Ru | 0.8 |
| Lower Shield Layer 105 | First Exchange Coupling Magnetic Field Application Layer 105c | NiFe CoFe | 20 1.5 |
| | First Anti-Ferromagnetic Layer 105b | IrMn | 6.0 |
| | First Main Shield Layer 105a | NiFe | 2000 |

The lower shield layer 105 includes a first main shield layer 105a, and a first anti-ferromagnetic layer 105b and a first exchange coupling magnetic field application layer 105c that are laminated above the first main shield layer 105a. The magnetization direction of the first exchange coupling magnetic field application layer 105c is pinned in the track width direction T due to anti-ferromagnetic coupling with the first anti-ferromagnetic layer 105b. Similarly, the upper shield layer 106 includes a second main shield layer 106a, and a second anti-ferromagnetic layer 106b and a second exchange coupling magnetic field application layer 106c that are laminated below the second main shield layer 106a. The magnetization direction of the second exchange coupling magnetic field application layer 106c is pinned in the track width direction T due to anti-ferromagnetic coupling with the second anti-ferromagnetic layer 106b. The first and second exchange coupling magnetic field application layers 105c and 106c are magnetized mutually in the same direction. In other embodiments, instead of disposing the first and second anti-ferromagnetic layers 105b and 106b and the first and second exchange coupling magnetic field application layers 105c and 106c, the first and second main shield layers 105a and 106a may be formed in a long and narrow shape extending in the track width direction T so that the magnetic domain becomes a single magnetic domain using a shape anisotropic effect and that the magnetization directions of the first and second main shield layers 105a and 106a are oriented in the same direction.

The first magnetic linkage layer 111 has a configuration in which gap adjustment layers 111b and 111d composed of CoFe and exchange coupling transmitting layers 111a, 111c and 111e composed of Ru are alternately laminated, and the exchange coupling transmitting layers 111a and 111e are positioned at both side end surfaces. The second magnetic linkage layer 118, in the same manner as the first magnetic linkage layer 111, also has a configuration in which a gap adjustment layer 118b composed of CoFe and exchange coupling transmitting layers 118a and 118c composed of Ru are alternately laminated, and the exchange coupling transmitting layers 118a and 118c are positioned at both side end surfaces. A pair of the magnetic layers 105c and 111b, a pair of the magnetic layers 111b and 111d, and a pair of the magnetic layers 111d and 115 that respectively sandwich the exchange coupling transmitting layers 111a, 111c and 111e, and a pair of the magnetic layers 106c and 118b and a pair of the magnetic layers 118b and 117 that respectively sandwich the exchange coupling transmitting layers 118a and 118c perform exchange coupling. As illustrated in FIG. 3, the magnetization directions of the layers 105c, 111b, 111d and 115, and the magnetization directions of the layers 106c, 118b and 117 alternately inverse (no bias magnetic field is applied).

The total film thickness of the MR element 104 can be adjusted to match the shield gap by adjusting the film thickness of the gap adjustment layers 111b, 111d and 118b. A smaller shield gap has more advantage to realize high recording density; however, the shield gap may be determined according to the required film thickness of the bias magnetic field application layer 132. In this case, it is preferred to adjust the total film thickness of the MR element 104, that is, the shield gap, by changing the film thickness of the gap adjustment layers 111b, 111d and 118b.

Figure 4:
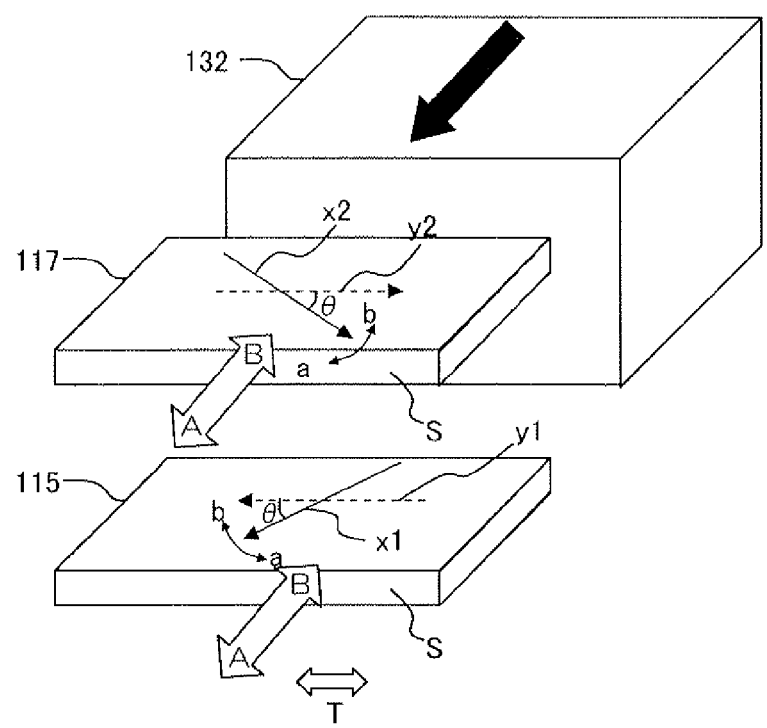
FIG. 4 is a schematic diagram illustrating a principle of performance of a thin film magnetic head according to the second embodiment.

The above-described MR element 104 performs operations as described hereinafter. A hypothetical condition will be considered first in which there is no bias magnetic field application layer 132. FIG. 4 is a schematic diagram illustrating the magnetizations of the first and second magnetization free layers 115 and 117. The magnetization directions of the first and second exchange coupling magnetic field application layers 105c and 106c are transmitted to the first and second magnetization free layers 115 and 117 through the exchange coupling transmitting layers 111a, 111c, 111e, 118a and 118c while being reversed by the gap adjustment layers 111b, 111d and 118b. Therefore, the first magnetization free layer 115 is magnetized in the track width direction T in an orientation y1 that is anti-parallel to the magnetization direction of the first exchange coupling magnetic field application layer 105c. The second magnetization free layer 117 is magnetized in the track width direction T in an orientation y2 that is the same as the magnetization direction of the second exchange coupling magnetic field application layer 106c.

Next, a condition will be considered in which a bias magnetic field is applied. The bias magnetic field causes the magnetization directions of the first and second magnetization free layers 115 and 117 in the track width direction T to rotate in a direction orthogonal to the air bearing surface S. As illustrated by the solid line arrows x1 and x2 in FIG. 4, the magnetization directions rotate by the prescribed angle θ in the directions opposite from each other from the broken line arrows y1 and y2, and ideally become orthogonal to each other. This is the magnetization state of the first and second magnetization free layers 115 and 117 when no external magnetic field is applied.

When the external magnetic field is applied in this state as illustrated by the outline arrows in the drawing, the magnetization directions of the first and second magnetization free layers 115 and 117 rotate in the directions opposite from each other according to the orientation of the external magnetic field. When the external magnetic field is applied in direction A in the drawing, the magnetization directions (the solid line arrows x1 and x2) of the first and second magnetization free layers 115 and 117 rotate in direction (a) in the drawing, and when the external magnetic field is applied in the direction B in the drawing, the magnetization directions of the first and second magnetization free layers 115 and 117 rotate in direction (b) in the drawing. In this manner, a relative angle formed by magnetization directions of the first and second magnetization free layers 115 and 117 changes according to the external magnetic field, and the resistance value for the sense current Sense varies based on the magneto-resistive effect. Utilizing this principle, the MR element 104 can detect the orientation and strength of the external magnetic field.

In this manner, the MR element 104 of the present embodiment includes a pair of magnetization free layers 115 and 117 in which the magnetization directions change according to the external magnetic field, and the spacer layer 116 sandwiched by the magnetization free layers 115 and 117. The MR element 104 differs from the first embodiment with regard to the point that the magnetization directions of the pair of the magnetization free layers 115 and 117 both rotate according to the external magnetic field; however, the same configuration of the spacer layer 16 in the first embodiment may be used for the spacer layer 116.

The magnetization directions of the first and second magnetization free layers 115 and 117 can be reversed by adjusting the total number of the Ru layers and the gap adjustment layers included in the first and second magnetic linkage layers 111 and 118. For example, when the magnetization directions of the upper shield layer 106 and the lower shield layer 105 are anti-parallel, the magnetization direction of the first magnetization free layer 115 can be reversed by configuring the first magnetic linkage layer 111 with two Ru layers 111*a* and 111*c* and a single gap adjustment layer 111*b* inserted therebetween as illustrated in Table 3. In the same manner, although illustration is omitted, effects similar to those from the configuration indicated in Table 2 can be obtained, by forming the second magnetic linkage layer 118 with a five layer configuration that is similar to the first magnetic linkage layer 111.

TABLE 3

| | Film Configuration | | Material | Film Thickness (nm) |
|---|---|---|---|---|
| Upper Shield Layer 106 | Second Main Shield Layer 106a | | NiFe | 2000 |
| | Second Anti-Ferromagnetic Layer 106b | | IrMn | 6.0 |
| | Second Exchange Coupling Magnetic Field Application Layer 106c | | CoFe | 1.5 |
| | | | NiFe | 20 |
| MR Element 104 | Second Magnetic Linkage Layer 118 | Exchange Coupling Transmitting Layer 118c | Ru | 0.8 |
| | | Gap Adjustment Layer 118b | CoFe | 1.0 |
| | | Exchange Coupling Transmitting Layer 118a | Ru | 0.8 |
| | Second Magnetization Free Layer 117 (Second Magnetic Layer L2) | | CoFe | 4.0 |
| | Spacer Layer 116 | Nonmagnetic Layer 116d | Zn or Cu | 0.4 |
| | | Main Spacer Layer 116c | GaOx | 0.9 |
| | | Metal Intermediate Layer 116b | Mg, Al, Zn or at least partially oxidized Mg, Al, Zn | 0.05-0.4 |
| | | Copper Layer 116a | Cu | 0.4 |
| | First Magnetization Free Layer 115 (First Magnetic Layer L1) | | CoFe | 4.0 |
| | First Magnetic Linkage Layer 111 | Exchange Coupling Transmitting Layer 111c | Ru | 0.8 |
| | | Gap Adjustment Layer 111b | CoFe | 1.0 |
| | | Exchange Coupling Transmitting Layer 111a | Ru | 0.8 |
| Lower Shield Layer 105 | First Exchange Coupling Magnetic Field Application Layer 105c | | NiFe | 20 |
| | | | CoFe | 1.5 |
| | First Anti-Ferromagnetic Layer 105b | | IrMn | 6.0 |
| | First Main Shield Layer 105a | | NiFe | 2000 |

Next, a method for manufacturing the above-described MR element will be explained using the MR element of the first embodiment as an example. First, the lower shield layer 5 is formed above the substrate W by a plating method with the insulating layer therebetween as needed. Next, each layer configuring the MR element 4 is formed by a sputtering. Specifically, after depressurizing a film forming chamber containing a target and the substrate W to a high vacuum atmosphere, inert gas such as argon is introduced into the film forming chamber. By ionized inert gas colliding to the target, fine particles are ejected from the target and a multilayer film is formed on the lower shield layer 5. Gallium oxide is used as the target when the main spacer layer 16*c* is formed.

The metal intermediate layer 16*b* may be originally formed as a film of an oxide; however, it is desirable that the metal intermediate layer 16*b* is formed as a film composed of Mg, Al or Zn (a mixture of two or more of these is also applicable) in a metal state. This is because Mg, Al and Zn function to trap oxygen as described above. By forming the film with one or more of these elements in a metal state during the film formation, more oxygen can be trapped. After the formation of the multilayer film, an annealing treatment is performed as needed.

After that, the formed multilayer is shaped in a pillar form of the MR element 4, and the side surfaces of the MR element 4 are covered with an insulating layer 31. Then, the bias magnetic field application layers 32 are formed on both sides in the track width direction T of the MR element 4, and the upper shield layer 6 is formed on the MR element 4 and the bias magnetic field application layers 32. In the case of the second embodiment, the bias magnetic field application layer 132 is formed on the backside of the MR element 4 as viewed from the air bearing surface S.

The Mg film, Al film and/or Zn film that form the metal intermediate layer 16b of the spacer 16 prevent oxidation of the first magnetic layer L1. For example, when the recording head 3 is formed above a wafer after the reproducing head 2 is formed, heat is applied during the manufacturing process of the recording head 3 so that high temperature environment may be temporarily generated; however, Mg, Al and Zn function as an oxidation prevention film while they are partially oxidized, or wholly oxidized in some case, by trapping oxygen.

First Example

An MR element with the film configuration illustrated in Table 2 was formed above a substrate composed of $Al_2O_3$—TiC (ALTIC) by using a sputtering device. A film configuration of a spacer layer was as indicated in Table 4. A gallium oxide layer was formed by a radio frequency (RF) sputtering method, and the other films were formed by a direct current (DC) magnetron sputtering method. At the time of forming the spacer layer, an Mg film, Al film or Zn film in metal state was formed on a copper layer. Accordingly, this table and Tables 5 and 6 indicate a metal layer instead of a metal intermediate layer. After the film formation, thermal (annealing) treatment was performed at 250° C. for three hours, and the MR element having a junction size of 0.2 μm×0.2 μm was manufactured. After the formation of the MR element, no annealing was performed. When no external magnetic field is applied, the directions of the first and second magnetization free layers are oriented orthogonally to each other; however, when an external magnetic field is applied, the directions freely rotate to generate magneto-resistive effects.

TABLE 4

| Spacer Layer Film Configuration | Material | Film Thickness (nm) |
|---|---|---|
| Nonmagnetic Layer | Zn | 0.4 |
| Main Spacer Layer | GaOx | 0.9 |
| Metal Layer | Mg, Al, Zn | 0.2-0.6 |
| Copper Layer | Cu | 0.4 |

With above-described MR element, MR ratios were obtained by changing materials and film thicknesses of the metal layer of the spacer layer as illustrated in Table 5. As a first comparative example, a sample having no metal layer was manufactured, and the MR ratios were obtained in the similar manner. MR ratios of other samples were normalized based on the MR ratio obtained in the comparative example set as 1.

TABLE 5

| | Film Thickness of layers configuring spacer layer | | | | Ratio of MR ratio to First comparative example |
|---|---|---|---|---|---|
| Sample | Copper Layer | Metal Layer | Gallium Oxide Layer | Nonmagnetic Layer | |
| First Comparative Example | 0.4 | No | 0.9 | Zn 0.4 | 1.00 |
| #1-2 | 0.4 | Mg 0.2 | 0.9 | Zn 0.4 | 0.99 |
| #1-3 | | Mg 0.4 | | | 0.98 |
| #1-4 | | Mg 0.6 | | | 0.75 |
| #1-6 | 0.4 | Zn 0.2 | 0.9 | Zn 0.4 | 1.02 |
| #1-7 | | Zn 0.4 | | | 1.00 |
| #1-8 | | Zn 0.6 | | | 0.82 |
| #1-10 | 0.4 | Al 0.2 | 0.9 | Zn 0.4 | 0.99 |
| #1-11 | | Al 0.4 | | | 0.95 |
| #1-12 | | Al 0.6 | | | 0.70 |

When film thicknesses of the Mg film, Al film and Zn film are in a range up to 0.4 nm, the MR ratio is almost the same as the first comparative example. This is considered because the film thicknesses of the Mg film, Al film and Zn film (metal film) added to the first comparative example were small. However, when the film thickness of the Mg film, Al film and Zn film is 0.6 nm, the MR ratio is largely reduced. This is considered because the film thickness of the metal film is large so that electrons are more likely to scatter.

Second Example

Next, MR ratios were obtained by changing the material and film thickness of the metal layer of the spacer layer having the film configuration of Table 4. In this example, each layer was formed in the film formation condition that is similar to the first example. After the MR element having a junction size of 0.2 μm×0.2 μm was manufactured, thermal (re-annealing) treatment was performed again at 250° C. for three hours. In the present example, a ratio (B/A) of a post-re-annealing MR ratio (B) to a pre-re-annealing MR ratio (A) was obtained for each sample to define a relative MR ratio. Similarly, with regard to an RA, a ratio (D/C) of a post re-annealing RA (D) to a pre-re-annealing RA (C) was obtained to define a relative RA.

TABLE 6

| Sample | Film Thickness of layers configuring spacer layer (nm) | | | | Property variation ratio due to heating | |
|---|---|---|---|---|---|---|
| | Copper Layer | Metal Layer | Gallium Oxide Layer | Nonmagnetic Layer | Relative MR ratio | Relative RA |
| Second Comparative Example | 0.4 | No | 0.9 | Zn 0.4 | 0.83 | 0.81 |
| #2-1 | 0.4 | Mg 0.05 | 0.9 | Zn 0.4 | 0.95 | 0.93 |
| #2-2 | | Mg 0.2 | | | 1.00 | 1.00 |
| #2-3 | | Mg 0.4 | | | 0.98 | 0.98 |
| #2-4 | | Mg 0.6 | | | 1.00 | 0.99 |
| #2-5 | | Mg 0.2 | | Cu 0.4 | 0.99 | 0.96 |
| #2-6 | 0.4 | Zn 0.05 | 0.9 | Zn 0.4 | 0.94 | 0.94 |
| #2-7 | | Zn 0.2 | | | 1.01 | 0.99 |
| #2-8 | | Zn 0.4 | | | 1.00 | 0.99 |
| #2-9 | | Zn 0.6 | | | 1.01 | 0.99 |
| #2-10 | | Zn 0.2 | | Cu 0.4 | 0.97 | 0.95 |
| #2-11 | 0.4 | Al 0.05 | 0.9 | Zn 0.4 | 0.96 | 0.93 |
| #2-12 | | Al 0.2 | | | 0.99 | 0.99 |
| #2-13 | | Al 0.4 | | | 0.98 | 0.99 |
| #2-14 | | Al 0.6 | | | 0.99 | 0.98 |
| #2-15 | | Al 0.2 | | Cu 0.4 | 0.97 | 0.96 |

When film thicknesses of the Mg film, Al film and Zn film are in a range up to 0.6 nm, the MR ratio does not vary largely before and after the re-annealing. This is considered because the metal film trapped oxygen and effectively prevented oxidation of the first magnetic layer. It is considered that oxygen reached to the first magnetic layer and that oxidation of the first magnetic layer progressed since a second comparative example had no metal film. Almost the same tendency was obtained with regard to the RA. When the film thicknesses of the Mg film, Al film and Zn film were in the range up to 0.6 nm, an effect on preventing variation of RA was confirmed. Similar results were also obtained when Cu was used as a nonmagnetic layer. As described above, since variation of the MR ratio and RA due to the re-annealing after the formation of the MR element is small, it can be said that reliability under a potentially high temperature environment where such as the inside of a hard disk drive is also high.

As a conclusion of the above description, when the film thicknesses of the Mg film, Al film and Zn film were in a range from 0.05 nm to 0.6 nm, oxidation prevention effects of similar levels were confirmed according to the second example. Also with regard to the RA, no large variation was confirmed. However, according to the first example, when the film thicknesses of the Mg film, Al film and Zn film were 0.6 nm, a value of the MR ratio was small. Therefore, preferable film thicknesses of the Mg film, Al film and Zn film are in a range from 0.05 nm to 0.4 nm.

Figure 5:
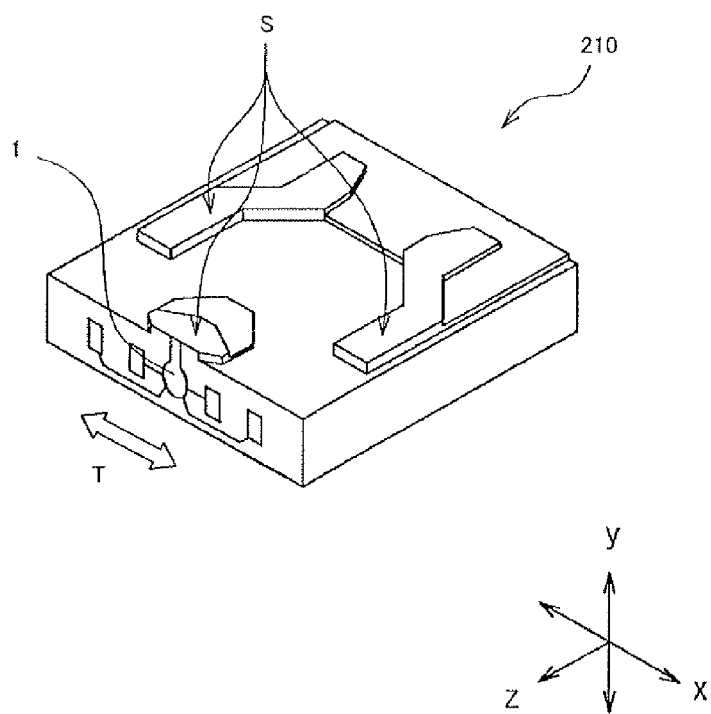
FIG. 5 is a perspective view of a magnetic head slider of the present invention.

Next, the description regarding a magnetic head slider on which the thin film magnetic head 1 is mounted will be given. Referring to FIG. 5, a magnetic head slider 210 has a substantially hexahedral shape, and one surface of the six outer surfaces is the recording air bearing surface S that opposes a hard disk. The magnetic head slider 210 is arranged in the hard disk drive device so as to oppose the hard disk, which is a disk-shaped recording medium M that is rotatably driven. When the hard disk rotates in the z-direction of FIG. 6, air flow passing between the hard disk and the magnetic head slider 210 generates a downward lifting force in the y-direction to the magnetic head slider 210. The magnetic head slider 210 flies above the surface of the hard disk due to the lifting force. In the vicinity of the edge part of the magnetic head slider 210 (edge part in bottom left of FIG. 5) on the air flow exit side, the thin film magnetic head 1 is formed.

Figure 6:
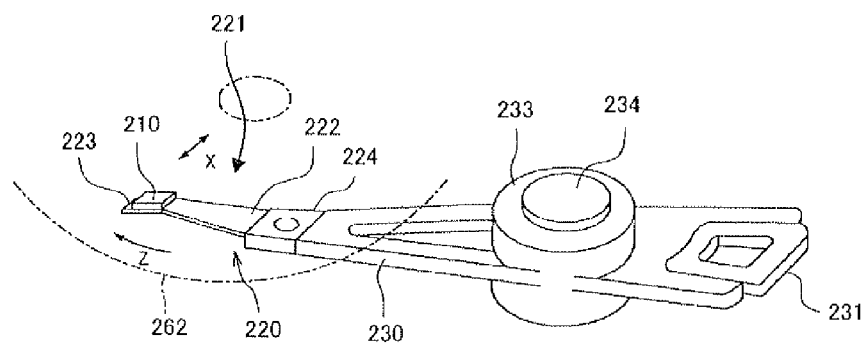
FIG. 6 is a perspective view of a head arm assembly of the present invention.

Referring to FIG. 6, a head gimbal assembly 220 includes the magnetic head slider 210 and a suspension 221 that elastically supports the magnetic head slider 210. The suspension 221 includes a load beam 222, a flexure 223 and a base plate 224. The load beam 222 is formed of stainless steel in a plate spring shape. The flexure 223 is arranged in one edge part of the load beam 222. The base plate 224 is arranged in the other edge part of the load beam 222. The magnetic head slider 210 is joined to the flexure 223 to give the magnetic head slider 210 suitable flexibility. At the part of the flexure 223 to which the magnetic head slider 210 is attached, a gimbal part is disposed to maintain the magnetic head slider 210 in an appropriate orientation.

An assembly in which the head gimbal assembly 220 is mounted to an arm 230 is referred to as a head arm assembly 221. The arm 230 moves the magnetic head slider 210 in a track crossing direction x of a hard disk 262. One edge of the arm 230 is attached to the base plate 224. To the other edge of the arm 230, a coil 231 that forms one part of a voice coil motor is attached. A bearing part 233 is disposed in the middle part of the arm 230. The arm 230 is rotatably supported by a shaft 234 attached to the bearing part 233. The arm 230 and the voice coil motor for driving the arm 230 configure an actuator.

Figure 7:
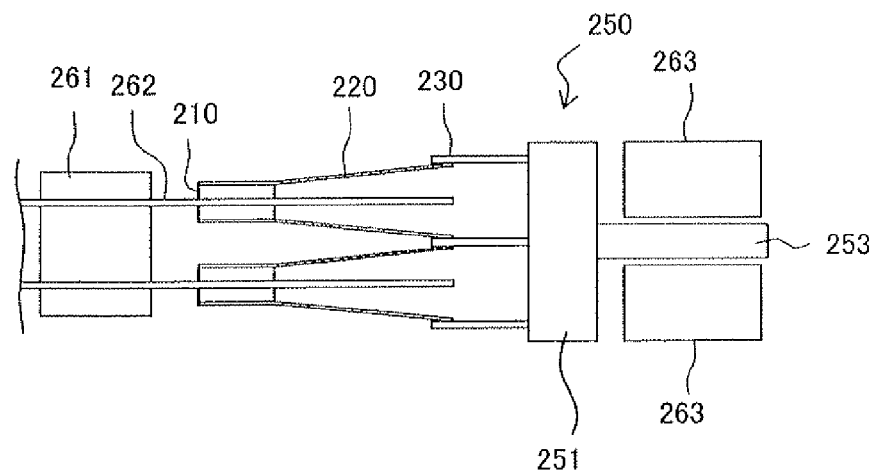
FIG. 7 is a side view of a head stack assembly of the present invention.
Figure 8:
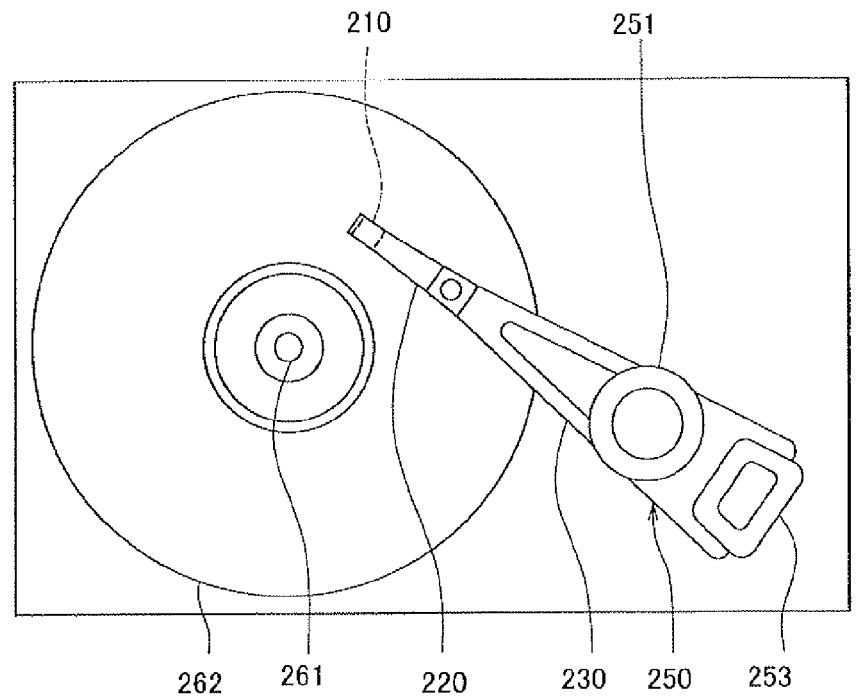
FIG. 8 is a plan view of a hard disk drive device of the present invention.

Next, referring to FIGS. 7 and 8, the description will be given with regard to a head stack assembly in which the above-described magnetic head slider is integrated, and the hard disk drive device. The head stack assembly is an assembly in which the head gimbal assembly 220 is attached to each arm of a carriage including a plurality of the arms. FIG. 7 is a side view of the head stack assembly, and FIG. 8 is a plan view of the hard disk drive device. The head stack assembly 250 includes a carriage 251 including a plurality of arms 230. On each of the arms 230, the head gimbal assembly 220 is attached so that the head gimbal assemblies 220 align mutually at an interval in the vertical direction. On the side of the carriage 251, which is the backside to the arm 230, a coil 253 is mounted to be a part of the voice coil motor. The voice coil motor includes permanent magnets 263 arranged so as to sandwich the coil 253 and to face each other.

Referring to FIG. 7, the head stack assembly 250 is integrated in the hard disk drive device. The hard disk drive device includes multiple hard disks 262 attached to a spindle motor 261. For each of the hard disks 262, two magnetic head sliders 210 are arranged in a manner of sandwiching the hard disk 262 and facing each other. The head stack assembly 250 except for the magnetic head slider 210 and the actuator correspond with a positioning device, support the magnetic head slider 210, and also position the magnetic head slider 210 with respect to the hard disk 262. The magnetic head slider 210 is moved in the track crossing direction of the hard disk 262 by the actuator, and is positioned with respect to the hard disk 262. The thin film magnetic head 11 included in the magnetic head slider 210 records information to the hard disk 262 with the recording head 3, and reproduces information recorded on the hard disk 262 with the reproducing heads 2 and 102.

While preferred embodiments of the present invention have been shown and described in detail, and it is to be understood that variety of changes and modifications may be made without departing from the spirit of scope of the following claims or its scope.

What is claimed is:

1. A magneto-resistive effect (MR) element, comprising:
    first and second magnetic layers in which a relative angle formed by magnetization directions changes in response to an external magnetic field; and
    a spacer layer positioned between the first magnetic layer and the second magnetic layer, wherein
    the first magnetic layer is positioned closer to a substrate above which the MR element is formed than the second magnetic layer; and
    the spacer layer includes a copper layer, a metal intermediate layer and a main spacer layer composed of gallium oxide as a primary component, the copper layer and the metal intermediate layer are positioned between the main spacer layer and the first magnetic layer, the metal intermediate layer is positioned between the copper layer and the main spacer layer, and the metal intermediate layer is composed of at least one member selected from a group consisting of one of magnesium and at least partially oxidized magnesium, as a primary component.

2. The MR element according to claim 1, wherein
    the spacer layer includes a nonmagnetic layer positioned between the main spacer layer and the second magnetic layer, and the nonmagnetic layer is composed of zinc, at least partially oxidized zinc, copper or at least partially oxidized copper.

3. A magnetic head, comprising:
    the MR element according to claim 1.

4. The magnetic head according to claim 3, wherein
    one of the first magnetic layer and the second magnetic layer is a magnetization free layer in which a magnetization direction changes in response to the external magnetic field, and the other is a magnetization pinned layer in which a magnetization direction is pinned, and
    the magnetic head further comprises a pair of bias magnetic field application layers that is disposed on both sides in a track width direction of the MR element and that applies a bias magnetic field in the track width direction to the magnetization free layer.

5. The magnetic head according to claim 3, wherein
    the first magnetic layer and the second magnetic layer are both magnetization free layers in which magnetization directions change in response to the external magnetic field, and
    the magnetic head further comprises a bias magnetic field application layer that is disposed on a backside of the MR element as seen from an air bearing surface and that applies a bias magnetic field in a direction orthogonal to the air bearing surface to the first and second magnetic layers.

6. A magnetic head slider, comprising:
    the magnetic head according to claim 3.

7. A head gimbal assembly, comprising:
    the magnetic head according to claim 3.

8. A hard disk drive device, comprising:
    the magnetic head according to claim 3.

* * * * *